(12) United States Patent
Sewell

(10) Patent No.: US 6,556,946 B2
(45) Date of Patent: Apr. 29, 2003

(54) LINEAR POSITION SENSOR

(75) Inventor: Roger Sewell, Cambridge (GB)

(73) Assignee: Caterpillar Inc, Peoria, IL (US)

( * ) Notice: Subject to any disclaimer, the term of this patent is extended or adjusted under 35 U.S.C. 154(b) by 143 days.

(21) Appl. No.: 09/740,488

(22) Filed: Dec. 19, 2000

(65) Prior Publication Data

US 2002/0111766 A1 Aug. 15, 2002

(51) Int. Cl.[7] .............. G01B 11/14; G01B 5/14
(52) U.S. Cl. ............ 702/163; 702/40; 702/159; 250/231.1; 250/559.01
(58) Field of Search ............ 702/163, 159, 702/40, 94; 250/559.13, 559.39, 231.15, 231.18, 559.01, 231.14, 231.1

(56) References Cited

U.S. PATENT DOCUMENTS

| 5,325,063 A | 6/1994 | Morgan |
| 5,539,993 A | 7/1996 | Kilpinen et al. |
| 5,612,906 A | 3/1997 | Gotz |
| 5,632,916 A | 5/1997 | Lappalainen et al. |
| 5,642,297 A | 6/1997 | Brady et al. |
| 5,825,307 A | 10/1998 | Titus et al. |
| 5,884,239 A | 3/1999 | Romanik, Jr. |
| 5,918,199 A | 6/1999 | Yang et al. |
| 5,956,659 A | 9/1999 | Spies et al. |
| 5,970,432 A | 10/1999 | Ishimoto et al. |
| 5,970,433 A | 10/1999 | Oka et al. |

FOREIGN PATENT DOCUMENTS

| EP | 0 635 115 B1 | 1/1997 |
| WO | WO 95/01510 | 1/1995 |

*Primary Examiner*—John Barlow
*Assistant Examiner*—Hien Vo
(74) *Attorney, Agent, or Firm*—Clifton G Green; Robin Spellman

(57) ABSTRACT

Apparatus and methods for determining a linear position of a moveable member having a code disposed thereupon. The code includes a succession of data fields having at least n characters and including a frame-synch symbol at predetermined intervals in the code. A sensor reads the code on a predetermined portion of the moveable member. The predetermined portion of the member includes code having at least one frame-synch symbol and n characters. The sensor transmits a data signal as a function of the read code. A processing device is coupled with the sensor to receive the data signal. The processing device transmits a position signal as a function of the data signal, with the position signal being indicative of the linear position of the moveable member.

21 Claims, 2 Drawing Sheets

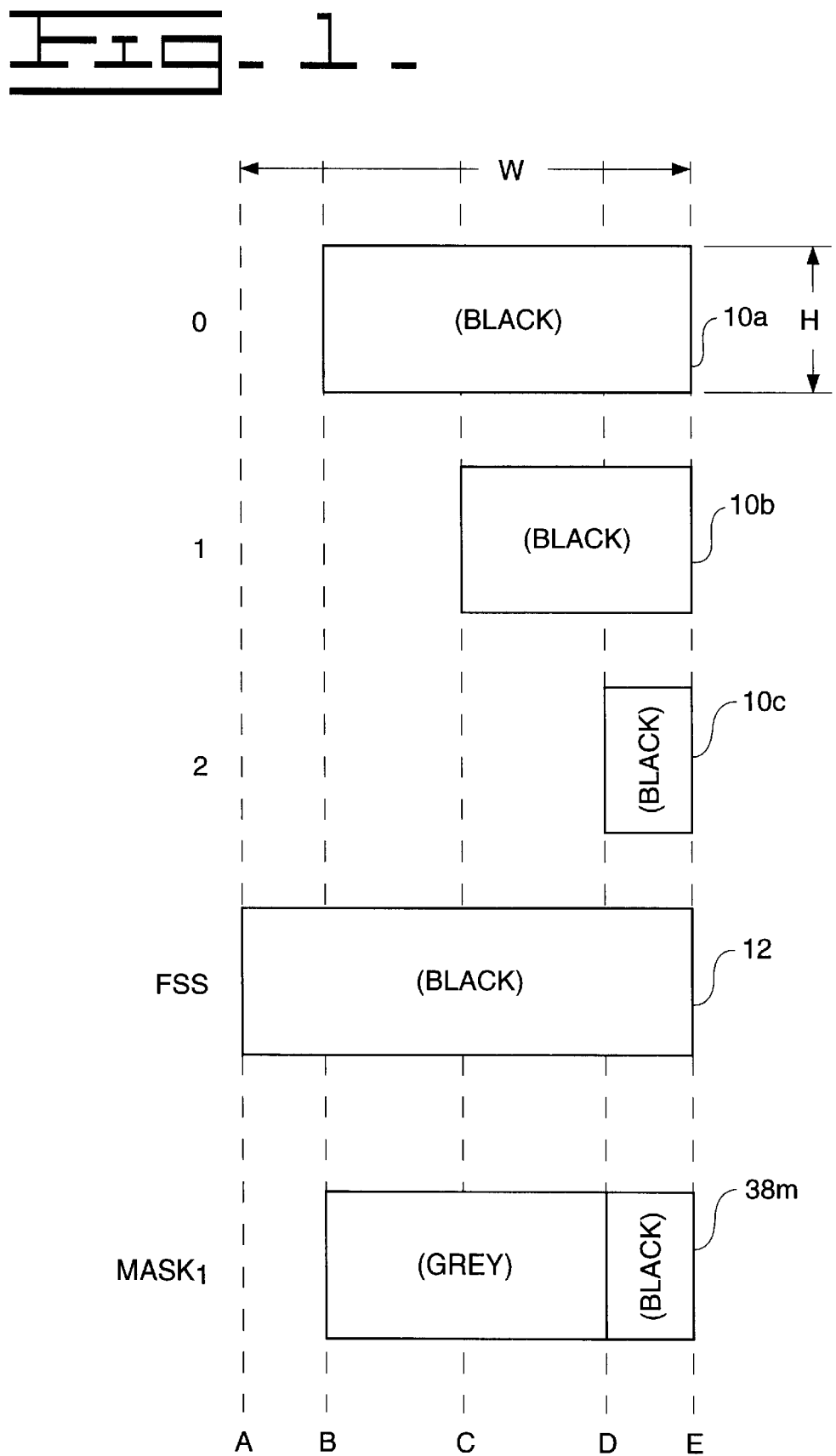

Fig-2-
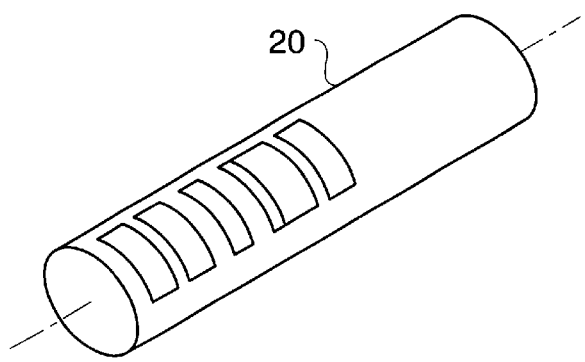
Fig-3-
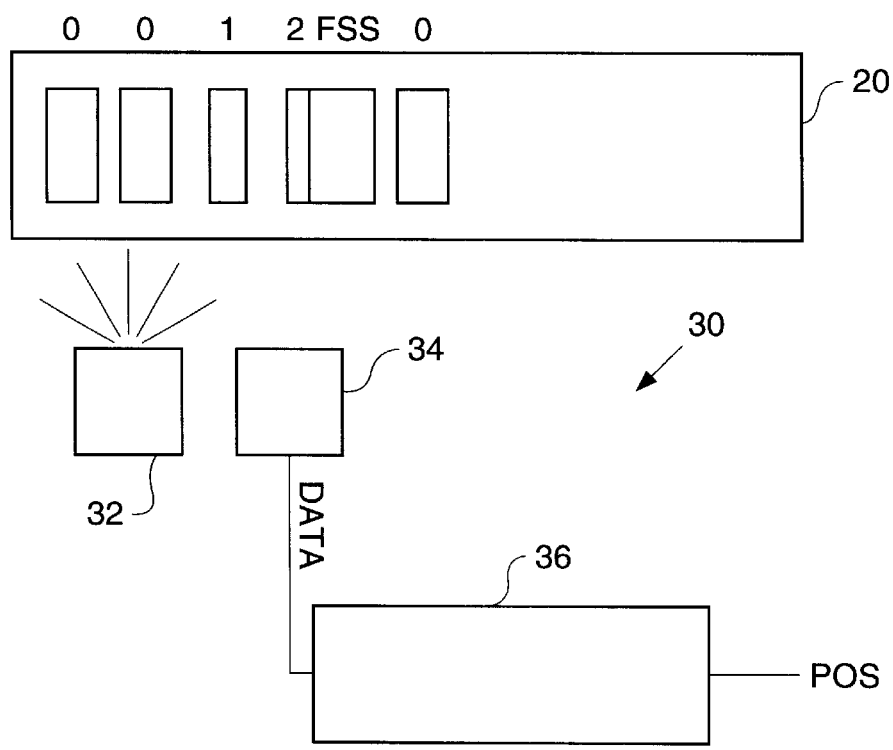

LINEAR POSITION SENSOR

TECHNICAL FIELD

This invention relates generally to determining the position of a moveable member, and more particularly to determining the linear position of a moveable member.

BACKGROUND

Determining a linear position of a moveable member has a variety of applications. For example, in order to know the position of a work tool of a work machine, such as a blade of a motor grader or a bucket of a wheel loader or excavator, the extension of a hydraulic cylinder that controls the position of the blade/bucket is often measured. These hydraulic cylinders are often quite long, ranging up to several meters in length.

In the past, conventional bar code type markings have been placed on the rods of hydraulic cylinders. By reading the bar code, the position of the rod within the cylinder may be determined.

One problem with this system is that complex markings are typically required in order to cover the significant length of the rod (in order to provide sufficient permutations of the code). These complex markings require relatively large amounts of processing power to decode. The processing power may be reduced by using a less complex code, but this typically results in a shorter length of the rod being marked by the code (because the code exhausts itself of combinations).

SUMMARY OF THE INVENTION

The present invention provides apparatus and methods for determining a linear position of a moveable member having a code disposed thereupon. The code includes a succession of data fields having at least n characters and including a frame-synch symbol at predetermined intervals in the code. A sensor reads the code on a predetermined portion of the moveable member. The predetermined portion of the member includes code having at least one frame-synch symbol and n characters. The sensor transmits a data signal as a function of the read code. A processing device is coupled with the sensor to receive the data signal. The processing device transmits a position signal as a function of the data signal, with the position signal being indicative of the linear position of the moveable member.

BRIEF DESCRIPTION OF THE DRAWINGS

FIG. 1 is a depiction of several characters of a code used for marking a moveable member according to one embodiment of the invention.

FIG. 2 is a marked rod according to one embodiment of the invention.

FIG. 3 is an apparatus for determining the linear position of the rod according to one embodiment of the invention.

DETAILED DESCRIPTION

FIG. 1 is a depiction of several characters 10 of a code used for marking a moveable member (not shown), such as a rod of a hydraulic cylinder, according to one embodiment of the invention. Each character 10 is typically a predetermined width W and a height H, and aligned with the moveable member so that the width W is parallel to the axis of movement of the rod.

The height H of each character may be selected to cover an appropriate circumference of the rod so that rotation of the rod during normal usage will not remove the character 10 from a viewing field of a sensor (not shown). The height H may be sufficient to completely surround the rod, e.g., a ring around the circumference, or it may only cover a portion of the circumference.

Each character 10 of the code typically includes a first predetermined portion of the width W of a first color, such as white, and a second predetermined portion of the width W of a second color, such as black. Other colors may also be chosen. Thus, a transition from white to black, for example, exists somewhere within the width W of each character 10 (with the possible exception of frame synch characters).

In one embodiment of the invention, a trinary (base 3) code is used, although other bases, either more or less, could be used as appropriate. For example, a "zero" 10a is depicted as a first portion (A-B for example) being white, with a second portion, such as a final portion, (B-E for example) being black. A "one" 10b is depicted as a first portion (A-C, for example) being white, with a second portion (C-E, for example) being black. A "two" 10c is depicted as a first portion (A-D, for example) being white, and a second portion (D-E, for example) being black. In other embodiments of the invention, the portions of each character 10 (a.k.a. "trit" for a base 3 code) that are black and white may be moved or otherwise adjusted as appropriate.

In one embodiment of the invention a first portion (A-B) of each trit 10 will be white, with a second portion (D-E) being black. These portions may be considered to be clock signals, and define the beginning and end points of each trit 10.

In one embodiment of the invention, seven trits 10 are used to define a data field (not shown), although a greater or lesser number of trits 10 could also be used.

Each data field is bracketed by a frame-synch symbol ("FSS") 12. The frame-synch symbol 12 is typically of the same width W and height H of the trits 10, but is a single color, such as black.

FIG. 2 is a marked rod 20 according to one embodiment of the invention. The length of the rod 20 to be measured is marked with a succession of data fields preceded and/or followed by the frame-synch symbol 12. Each data field is typically made up of a unique combination of trits 10.

FIG. 3 is an apparatus 30 for determining the linear position of the rod 20 according to one embodiment of the invention. The rod 20 is marked with the code described above consisting of several trits 10 preceded and/or followed by a frame-synch symbol 12.

In one embodiment of the invention, a light source 32 transmits a light onto the portion of the rod 20 marked with the trits 10. The light source 32 may be omitted if sufficient ambient light exists. A sensor 34 reads the magnitude of the brightness of the trits 10 over a predetermined portion of the rod 20, such as a width of 8*W. This typically allows the sensor 34 to read seven trits 10 and one frame-synch symbol 12. The sensor 34 transmits a data signal DATA as a function of the brightness of the read trits 10.

A processing device 36 is coupled with the sensor 34 to receive the data signal DATA. The processing device 36 may be any of a variety of appropriate devices known to those skilled in the art, such as a microprocessor or controller, for example. The processing device 36 transmits a position signal POS as a function of the data signal. The position signal is indicative of the linear position of the rod 20.

Referring back to FIG. 1, in determining the position signal POS, in one embodiment of the invention, the processing device 36 constructs a virtual first template or mask 38. The first mask 38 typically includes m sections (one of which is shown in FIG. 1), with each section having a portion or portions matching that of the trits 10. For example, because each of the trits 10 includes a white portion (A-B) and a black portion (D-E), the first mask 28 may also. Thus, the first mask 38 is in effect respective portions of n characters of the code.

In addition, the first mask 38 may include a third portion (B-D) that is a third or different color, such as grey, although other colors may be chosen as appropriate. This third portion (B-D) is the portion of the trits 10 that is not the same for all of the trits 10, e.g., is black for a "zero", half black and half white for a "one", and all white for a "two". Typically m will equal the number of characters in the data field plus one, e.g., eight in our example, although m may be other appropriate values.

In effect, the processing device 36 overlays the first mask 38 with the read portion of the code. The processing device 36 assigns a value to each brightness level. For example, black may have a value of negative one ("−1"), grey may have a value of zero ("0"), and white may have a value of one ("1"). Other values may be chosen, however a value of zero works best for the grey sections as will be evident below, with the values for black and white having an equal magnitude but opposite sign.

The processing device 36 performs a correlation between the mask 38 and the read code by any of a variety of ways known to those skilled in the art. In one embodiment of the invention, the processing device 36 performs a summation:

$$\sum_i x_i y_i$$

wherein
  $x_i$ comprises the brightness of the mask over a predetermined section of the read code, and
  $y_i$ comprises the brightness of the read code over the predetermined section.

The mask is then incrementally moved over the section of the read code, and the summation is repeated.

Because of the values assigned above, the summation will have a maximum value where the white portion of the mask (A-B) aligns with a white portion of the trit 10 and where the black portion of the mask (D-E) aligns with a black portion of the trit 10. Simplified slightly, mathematically the summation would be (1*1), (white on white) plus (−1*−1), (black on black). Where a white portion of the mask overlays a black portion of the read code (or vice versa color-wise), the summation would be a negative number:minus one time positive one, or vice versa. Thus, the summation has a maximum value where each section 38m of the first mask 38 aligns with the edges of the trit 10.

Using a value of zero for the grey portion of the mask segment 38m causes the processing device 36 to ignore (null out) the portion of the trits 10 between B-D (where the trits 10 are not identical). Thus, the processing device 36 determines the locations of the clock signal portions of the trits (A-B and D-E).

Having determined the best location of the first mask against the received image, each trit may now be individually decoded by comparing correlation of the received image with versions of the mask in which the grey part is replaced for one trit by either the pattern corresponding to a frame synch, a 0, a 1, or a 2; the value giving the greatest correlation is initially taken as the correct decoded value of that trit.

By reading the value of the trits 10 of the read code, the processing device 36 then knows the linear position of the rod 20, except for one problem. If the processing device reads "0120120" for the seven trits 10 in the read code, there is no easy way to determine whether the rod 20 is at the location specified by data field "0120120", or if it is at the location of where one data field ends in "0" and the next data field begins "120120", or if it is at a location where one data field ends "01" and the next data field begins "20120", etc. Determining the location of the frame-synch symbol 12 within the read code, however, solves this problem. This determination may be made by ways known to those skilled in the art.

The frame-synch symbol 12 will decrease the value of the summation correlation discussed above, however this decrease should be uniform for each summation assuming that one frame-synch symbol 12 is in each read code/mask comparison.

In one embodiment of the invention, if no frame-synch symbol 12 is detected in the read code on the predetermined portion of the rod 20, the processing device 36 will chose the most likely location and treat (force) that location as the frame-synch symbol 12. If more than one frame-synch symbol 12 is detected then one of them must be an error, given that only a width of 8*W of the code has been read, and that a frame-synch symbol 12 occurs every eighth character in the above example.

Additional considerations to the above embodiments of the invention may be needed in the real world. For example, the hydraulic cylinder that the rod 20 is located within is typically filled with hydraulic fluid or other medium. This fluid alters the reflective qualities of the code, often blurring the image received by the sensor 34.

In one embodiment of the invention, the processing device blurs the mask by any of a variety of ways known to those skilled in the art. Thus, referring back to FIG. 1, the sharp white to black grey transition at point B of mask section 38m and the sharp grey to black transition at point D become gradual shading changes.

The gradual shading changes may be assigned different values for the correlation summation described above. One typical type of sensor 34 known to those skilled in the art has a grey scale of 0–4095. Thus, for purposes of the correlation summation, dark grey may have a value of −0.9, medium grey may have a value of −0.6, and light grey may have a value of +0.3, for example. Other values may be chosen as appropriate.

In one embodiment of the invention it may be desirable to dynamically calibrate the processing device 36 for the level of brightness received by the sensor 34. For example, if the fluid in the cylinder is particularly dark, even a white portion of a trit may be read as 600 on the grey scale of 0–4095. One way to compensate for this is to determine the range of brightnesses received by the sensor over the portion of the code read and arbitrarily determine that the darkest grey scale value received will be considered to be "black" and the lightest grey scale value to be "white".

Further, in order to easily have black be considered to have a negative one value and white to have a positive one value, by subtracting the average of the lightest and darkest grey scale values, the processing device effectively skews the grey scale from (0 to X) to (−½X to ½X). This allows the grey area (B-D) of the mask segment 38M to be a zero. In effect, this technique removes the dc component of the brightness of the image. Other techniques known to those skilled in the art may also be used.

A second type of blurring that may occur is due to motion of the rod 20. In one embodiment of the invention the processing device 36 may blur the mask 38 by ways known to those skilled in the art to match the blurring of the read code due to the motion of the rod. This requires the processing device 36 to have an estimate of the velocity of the movement of the rod 20, which may be accomplished by any of a variety of ways known to those skilled in the art.

In one embodiment of the invention a second mask (not shown) may be used to determine the position of the rod 20. The second mask is typically used after the location of the rod 20 is determined according to the method described above. Once the values of the trits 10 read by the sensor 34 are known, the processing device 36 constructs the second mask. The second mask consists of the first mask except where the grey was in the first mask (B-D) for each segment 38$m$, the actual color from the trit 10 in that segment is filled in. Thus, a better correlation may be achieved because a larger sample size is used. The correlation summation is otherwise performed in a similar manner to that which is described above, including blurring, if appropriate, and will not be repeated.

In one embodiment of the invention a "short" method of determining the linear position of the rod 20 may be used. The short method depends on being able to predict the position of the rod 20 to within some predetermined relatively small range on the basis of the previously determined positions of the rod 20. Such a prediction may use a model that places limits on the possible velocity, acceleration, and/or jerk (the time derivative of acceleration) of the rod 20 based on previous known positions, velocities, etc.

Where the prior behavior of the rod 20 is known, the processing device 36 may create a mask 38 for the trits 10 expected/known to be in the possible range for the rod 20 is expected to be, and steps the mask 38 until an appropriate correlation is found. A high sampling frequency for the sensor 34 will reduce the possible positions of the rod 20.

In one embodiment of the invention a predetermined degree of correlation is required before the position of the rod 20 is considered to be known. For example, the determined position of the rod 20 will be not be considered to be accurate unless:

$\emptyset < 26$ degrees, where $$\cos\emptyset = \sum_i x_i y_i \Big/ sq.\ rt\left[\left(\sum_i x_i^2\right)*\left(\sum_i y_i^2\right)\right]$$

Other numbers may also be chosen as a limit for $\emptyset$.

INDUSTRIAL APPLICABILITY

The invention described herein may be used almost anywhere the linear movement of a moveable member is desired. It may be employed in determining the position of hydraulic cylinders in construction and earthmoving machines, in robotic applications, and/or a variety of other applications known to those skilled in the art.

From the foregoing, it will be appreciated that various embodiments have been disclosed for purposes of example, and not limitation. Accordingly, the invention is not limited except as by the attached claims.

What is claimed is:

1. An apparatus for determining a linear position of a moveable member, comprising:

a moveable member having a code disposed thereupon, the code including a succession of data fields each having at least n characters and including a frame-synch symbol at predetermined intervals in the code;

a sensor operable to read the code on a predetermined portion of the moveable member, the predetermined portion of the member including code having at least one frame-synch symbol and n characters, and operable to transmit a data signal as a function of the read code; and a processing device coupled with the sensor to receive the data signal and operable to transmit a position signal as a function of the data signal, the position signal being indicative of the linear position of the moveable member.

2. The apparatus of claim 1 wherein the processing device is operable to determine a first mask and to align the first mask with the code on the predetermined portion of the moveable member as a function of a correlation formula.

3. The apparatus of claim 1 wherein the first mask comprises respective portions of n characters of the code.

4. The apparatus of claim 1 wherein the first mask comprises blurred respective portions of n characters of the code.

5. The apparatus of claim 2 wherein the correlation formula comprises:

$$\sum_i x_i y_i$$

wherein $x_i$ comprises the brightness of the mask over a predetermined section of the predetermined portion of the moveable member, and $y_i$ comprises the brightness of the read code over the predetermined section of the predetermined portion of the moveable member.

6. The apparatus of claim 1 wherein the processing device is operable to determine a second mask and to align the second mask with the code on the predetermined portion of the moveable member as a function of a correlation formula.

7. The apparatus of claim 6 wherein the second mask comprises n characters of the code.

8. The apparatus of claim 6 wherein the second mask comprises blurred n characters of the code.

9. The apparatus of claim 1 wherein each character of the code comprises a predetermined width in the direction of movement of the moveable member, the predetermined width having a first predetermined portion having a first color and a second predetermined portion having a second color.

10. The apparatus of claim 1 wherein the frame-synch symbol comprises a predetermined width in the direction of movement of the moveable member of a single color.

11. The apparatus of claim 1 wherein the processing device is operable to determine and align the first mask as a function of a last known linear position of the moveable member.

12. A method for determining a linear position of a moveable member having a code disposed thereupon, the code including a succession of data fields having at least n characters and including a frame-synch symbol at predetermined intervals in the code, comprising:

reading the code on a predetermined portion of the moveable member, the predetermined portion of the member including code having at least one frame-synch symbol and n characters;

aligning a first mask with the read code as a function of a correlation formula; and determining a linear position of the moveable member as a function of the alignment of the first mask when the correlation formula has a predetermined characteristic.

13. The method of claim 12 wherein the first mask comprises respective portions of n characters of the code.

14. The method of claim 12 wherein the first mask comprises respective blurred portions of n characters of the code.

15. The method of claim 12 wherein the correlation formula comprises:

$$\sum_i x_i y_i$$

wherein $x_i$ comprises the brightness of the mask over a predetermined section of the predetermined portion of the moveable member, and $y_i$ comprises the brightness of the read code over the predetermined section of the predetermined portion of the moveable member.

16. The method of claim 12, further comprising aligning a second mask with the read code as a function of a correlation formula.

17. The method of claim 16 wherein the second mask comprises n characters of the code.

18. The method of claim 16 wherein the second mask comprises blurred n characters of the code.

19. The method of claim 12 wherein each character of the code comprises a predetermined width in the direction of movement of the moveable member, the predetermined width having a first predetermined portion having a first color and a second predetermined portion having a second color.

20. The method of claim 12 wherein the frame-synch symbol comprises a predetermined width in the direction of movement of the moveable member of a single color.

21. The method of claim 12 wherein aligning the first mask with the read code as a function of a correlation formula comprises aligning the first mask with the read code as a function of a correlation formula and a last known linear position of the moveable member.

* * * * *